United States Patent [19]

Oh

[11] Patent Number: 5,606,292
[45] Date of Patent: Feb. 25, 1997

[54] RING OSCILLATOR HAVING ITS OUTPUT AMPLIFIED IN A COMPARATOR

[75] Inventor: Young N. Oh, Kyoungki-do, Rep. of Korea

[73] Assignee: Hyundai Electronic Industries Co., Ltd., Kyoungki-Do, Rep. of Korea

[21] Appl. No.: 574,134

[22] Filed: Dec. 18, 1995

[30] Foreign Application Priority Data

Dec. 31, 1994 [KR] Rep. of Korea ............... 94-40569

[51] Int. Cl.$^6$ ................................ H03B 5/02
[52] U.S. Cl. ................ 331/57; 331/74; 331/108 A; 331/173
[58] Field of Search ................ 331/57, 74, 75, 331/108 A, 173

[56] References Cited

U.S. PATENT DOCUMENTS 5,442,325   8/1995   Bosshart ................ 331/74

Primary Examiner—Siegfried H. Grimm
Attorney, Agent, or Firm—Reid & Priest LLP

[57] ABSTRACT

A ring oscillator for a semiconductor device comprising a ring oscillation circuit for generating a pulse signal according to a logic state of a control signal, the pulse signal having a predetermined period and a reduced operating voltage level, a comparator for comparing the pulse signal from the ring oscillation circuit with a reference voltage signal according to the logic state of the control signal and amplifying it in accordance with the compared result, and a driver for buffering an output signal from the comparator. The ring oscillation circuit includes an inverter chain for supplying the pulse signal with the reduced operating voltage level. According to the present invention, power consumption can significantly be reduced in the ring oscillation circuit.

9 Claims, 3 Drawing Sheets

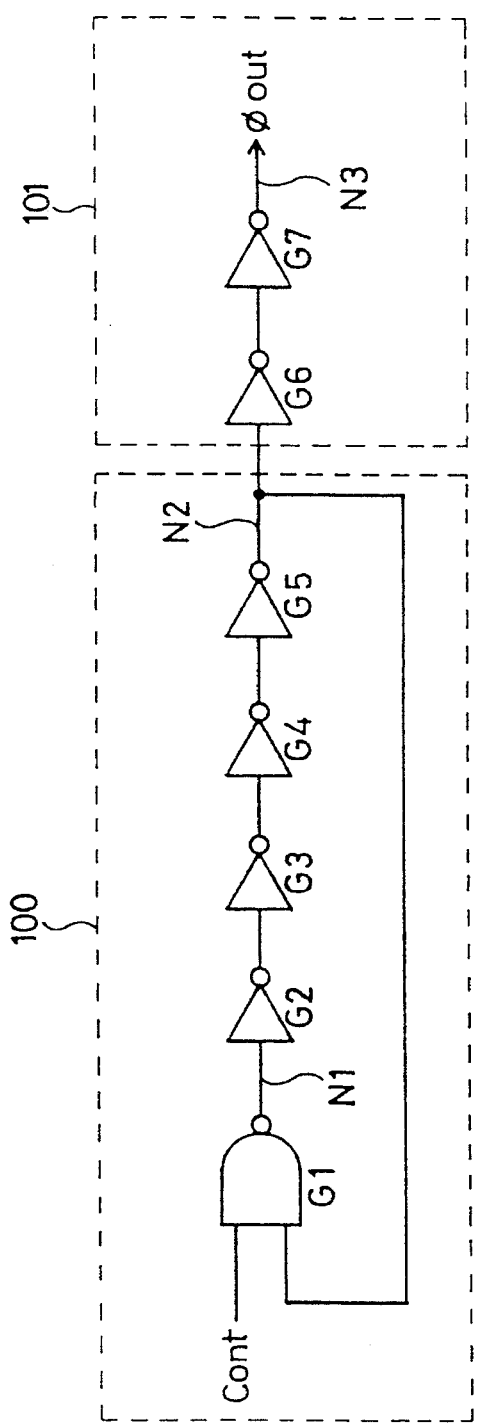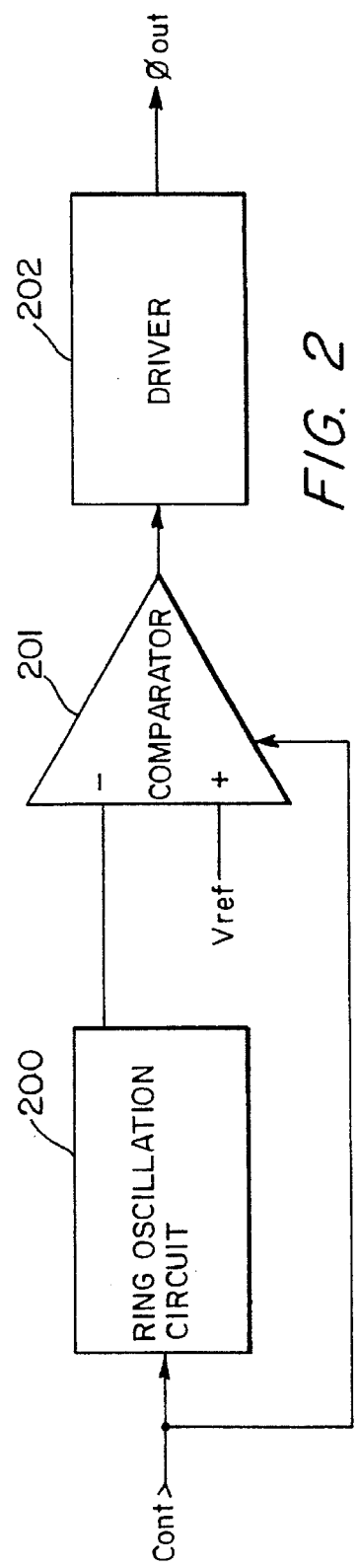
FIG. 1
(PRIOR ART)
FIG. 2

5,606,292

RING OSCILLATOR HAVING ITS OUTPUT AMPLIFIED IN A COMPARATOR

BACKGROUND OF THE INVENTION

1. Field of the Invention

The present invention relates in general to a ring oscillator for a semiconductor device which generates a high voltage for substrate bias and self-refresh operations, and more particularly to a ring oscillator for minimizing power consumption in a ring oscillation circuit thereof.

2. Description of the Prior Art

Referring to FIG. 1, there is shown a circuit diagram of a conventional ring oscillator for a semiconductor device. As shown in this drawing, the conventional ring oscillator comprises a ring oscillation circuit 100 and a driver 101. The ring oscillation circuit 100 includes a NAND gate G1 for NANDing a control signal Cont and a signal at a node N2 and outputting the NANDed result to a node N1, and inverters G2–G5 connected in series between the nodes N1 and N2. The driver 101 includes inverters G6 and G7 connected in series between the node N2 and a node N3.

Only in the case where the control signal Cont is high in logic, the ring oscillation circuit 100 outputs a pulse signal with a predetermined period to the node N2 to supply it to the driver 101.

However, consumption power in the inverters G2–G5 of the ring oscillation circuit 100 is proportional to the square of an operating voltage in the operating mode where the control signal Cont is high in logic. For this reason, the above-mentioned conventional ring oscillator for the semiconductor device has a disadvantage in that it is large in power consumption.

SUMMARY OF THE INVENTION

Therefore, the present invention has been made in view of the above problem, and it is an object of the present invention to provide a ring oscillator for a semiconductor device which is capable of minimizing power consumption in a ring oscillation circuit thereof.

In accordance with the present invention, the above and other objects can be accomplished by a provision of a ring oscillator for a semiconductor device comprising ring oscillation means for generating a pulse signal according to a logic state of a control signal, the pulse signal having a predetermined period and a reduced operating voltage level; and comparison means for comparing the pulse signal from the ring oscillation means with a reference voltage signal according to the logic state of the control signal and amplifying it in accordance with the compared result.

The ring oscillator for the semiconductor device further comprises drive means for buffering an output signal from the comparison means.

BRIEF DESCRIPTION OF THE DRAWINGS

The above and other objects, features and advantages of the present invention will be more clearly understood from the following detailed description taken in conjunction with the accompanying drawings, in which:

FIG. 1 is a circuit diagram of a conventional ring oscillator for a semiconductor device;

FIG. 2 is a block diagram of a ring oscillator for a semiconductor device in accordance with an embodiment of the present invention;

DETAILED DESCRIPTION OF THE PREFERRED EMBODIMENTS

Referring to FIG. 2, there is shown a block diagram of a ring oscillator for a semiconductor device in accordance with an embodiment of the present invention. As shown in this drawing, the ring oscillator comprises a ring oscillation circuit 200 for generating a pulse signal with a predetermined period according to a logic state of a control signal Cont, a comparator 201 for comparing the pulse signal from the ring oscillation circuit 200 with a reference voltage signal Vref according to the logic state of the control signal Cont and amplifying it in accordance with the compared result, and a driver 202 for buffering an output signal from the comparator 201.

When the control signal Cont is low in logic, the ring oscillation circuit 200 and comparator 201 are turned off, thereby causing the driver 202 to output no pulse signal. As a result, the driver 202 outputs a high logic signal.

On the contrary, in the case where the control signal Cont is high in logic, the ring oscillation circuit 200 generates the pulse signal with the predetermined period. The comparator 201 compares the pulse signal from the ring oscillation circuit 200 with the reference voltage signal Vref and amplifies it in accordance with the compared result. The comparator 201 then supplies the amplified signal to the driver 202. As a result, the driver 202 outputs a pulse signal in response to the output signal from the comparator 201.

Figure 3:
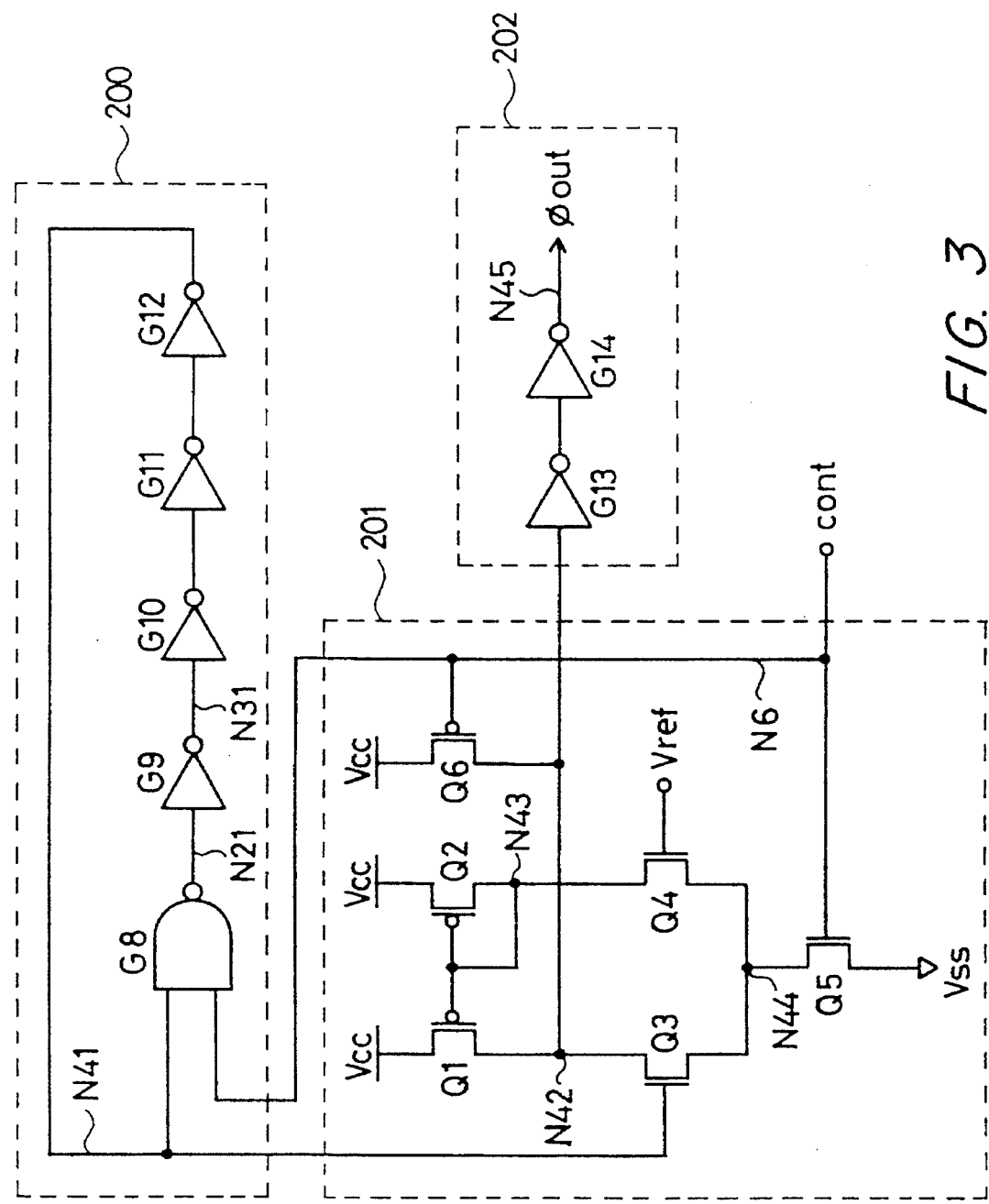
FIG. 3 is a detailed circuit diagram of the ring oscillator in FIG. 2.

Referring to FIG. 3, there is shown a detailed circuit diagram of the ring oscillator in FIG. 2. As shown in this drawing, the ring oscillation circuit 200 includes a NAND gate G8 for NANDing the control signal Cont and a signal at a node N41 and outputting the NANDed result to a node N21, and inverters G9–G12 connected in series between the nodes N21 and N41.

The comparator 201 includes a PMOS transistor Q1 connected between a supply voltage source Vcc and a node N42, and a PMOS transistor Q2 connected between the supply voltage source Vcc and a node N43. The PMOS transistors Q1 and Q2 have their gates connected in common to the node N43. The comparator 201 further includes an NMOS transistor Q3 connected between the node N42 and a node N44, and an NMOS transistor Q4 connected between the nodes N43 and N44. The NMOS transistor Q3 has its gate connected to the node N41 and the NMOS transistor Q4 has its gate for inputting the reference voltage signal Vref. The comparator 201 further includes an NMOS transistor Q5 connected between the node N44 and a ground voltage source Vss, and a PMOS transistor Q6 connected between the supply voltage source Vcc and the node N42. The NMOS and PMOS transistors Q5 and Q6 have their gates for inputting the control signal Cont.

The driver 202 includes inverters G13 and G14 connected in series between the node N42 and an output node N45.

The detailed constructions of the NAND gate G8 and inverters G9–G12 in the ring oscillation circuit 200 will first be described with reference to FIGS. 4A to 5B before the operation of the above-mentioned construction in accordance with the embodiment of the present invention is described.

Figures 4A, 4B:
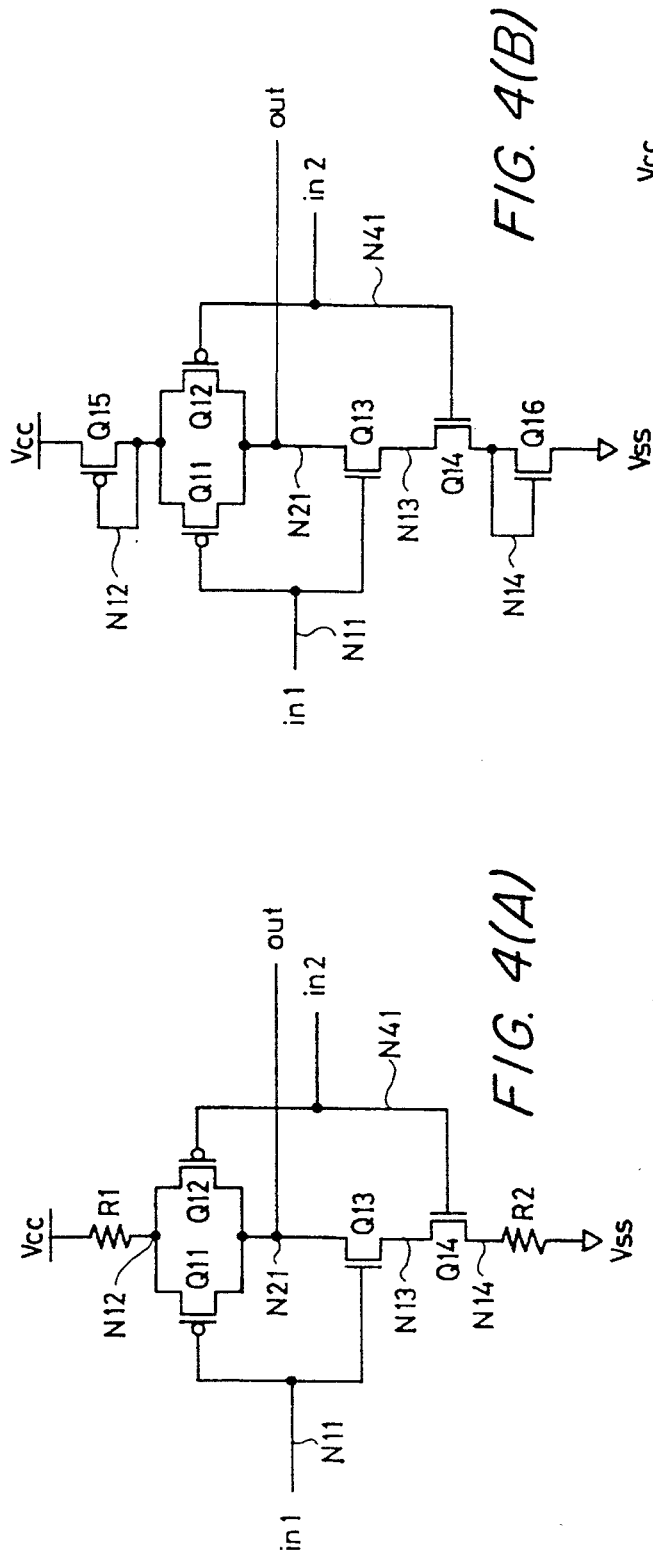
FIGS. 4A and 4B circuit diagrams illustrating equivalent circuits of a NAND gate in a ring oscillation circuit in FIG. 3.

FIGS. 4A and 4B show different equivalent circuits of the NAND gate G8 in the ring oscillation circuit 200.

In FIG. 4A, the NAND gate G8 includes a resistor R1 connected between the supply voltage source Vcc and a node N12, and PMOS transistors Q11 and Q12 connected in parallel between the node N12 and a node N21. The PMOS transistor Q11 has its gate connected to a node N11 and the PMOS transistor Q12 has its gate connected to the node N41. The NAND gate G8 further includes an NMOS transistor Q13 connected between the node N21 and a node N13, an NMOS transistor Q14 connected between the node N13 and a node N14, and a resistor R2 connected between the node N14 and the ground voltage source Vss. The NMOS transistor Q13 has its gate connected to the node N11 and the NMOS transistor Q14 has its gate connected to the node N41.

The construction of FIG. 4B is the same as that of FIG. 4A, with the exception that a PMOS transistor Q15 is connected between the supply voltage source Vcc and the node N12 instead of the resistor R1 and an NMOS transistor Q16 is connected between the node N14 and the ground voltage source Vss instead of the resistor R2. In this construction, the PMOS transistor Q15 has its gate connected to the node N12 and the NMOS transistor Q16 has its gate connected to the node N14.

Figure 5B:
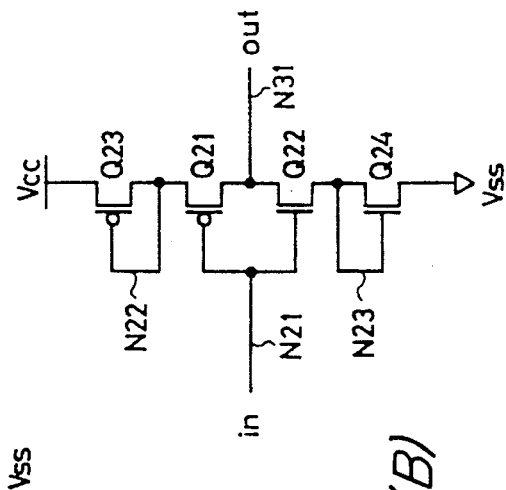
FIGS. 5A and 5B are circuit diagrams illustrating equivalent circuits of an inverter in the ring oscillation circuit in FIG. 3.
Figure 5A:
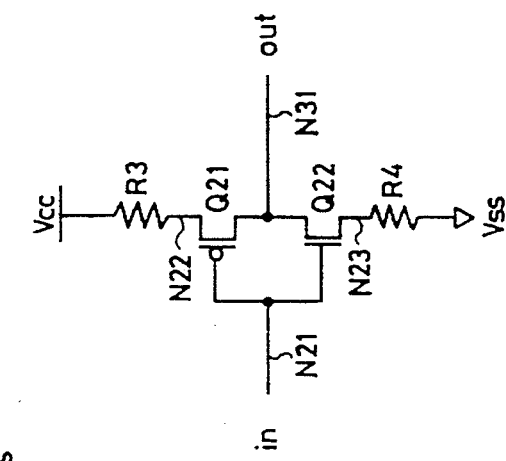

FIGS. 5A and 5B show different equivalent circuits of the inverter G9 in the ring oscillation circuit 200. The constructions of the inverters G10–G12 are the same as that of the inverter G9 and a detailed drawing and description thereof will thus be omitted.

In FIG. 5A, the inverter G9 includes a resistor R3 connected between the supply voltage source Vcc and a node N22, a PMOS transistor Q21 connected between the node N22 and a node N31, an NMOS transistor Q22 connected between the node N31 and a node N23, and a resistor R4 connected between the node N23 and the ground voltage source Vss. The PMOS and NMOS transistors Q21 and Q22 have their gates connected in common to the node N21.

The construction of FIG. 5B is the same as that of FIG. 5A, with the exception that a PMOS transistor Q23 is connected between the supply voltage source Vcc and the node N22 instead of the resistor R3 and an NMOS transistor Q24 is connected between the node N23 and the ground voltage source Vss instead of the resistor R4. In this construction, the PMOS transistor Q23 has its gate connected to the node N22 and the NMOS transistor Q24 has its gate connected to the node N23.

The operation of the ring oscillator for the semiconductor device with the above-mentioned construction in accordance with the embodiment of the present invention will hereinafter be described in detail with reference to FIG. 3.

The control signal Cont is applied to the ring oscillation circuit 200. When the control signal Cont inputted to the ring oscillation circuit 200 is high in logic, a pulse signal with a predetermined period is produced at the node N41. At this time, the produced pulse signal has a reduced operating voltage level as compared with that from the conventional ring oscillation circuit 100 in FIG. 1. In accordance with the preferred embodiment of the present invention, the reduced operating voltage level of pulse signal can be obtained by connecting resistors or transistors to the supply voltage source Vcc and ground voltage source Vss in the NAND gate G8 and inverters G9–G12. In this case, the additional resistors or transistors are adapted to reduce a level of a supply voltage to the following stage.

On the contrary, in the case where the control signal Cont inputted to the ring oscillation circuit 200 is low in logic, the node N41 is fixed to high in logic, thereby providing no pulse signal. In other words, only when the control signal Cont is high in logic, the ring oscillation circuit 200 produces the pulse signal with the predetermined period at the node N41 and supplies the produced pulse signal to the comparator 201. As stated previously, the pulse signal at the node N41 has high and low logic levels lower than those in the conventional ring oscillation circuit 100 in FIG. 1. For reference, the control signal Cont is supplied from a refresh counter circuit.

The control signal Cont is also applied to the comparator 201. When the control signal Cont inputted to the comparator 201 is low in logic, the NMOS transistor Q5 is turned off, whereas the PMOS transistor Q6 is turned on, thereby causing the node N42 to be fixed to high in logic. As a result, the output signal from the driver 202 is fixed to high in logic, thereby providing no pulse signal.

On the other hand, in the case where the control signal Cont inputted to the comparator 201 is high in logic, the NMOS transistor Q5 is turned on, whereas the PMOS transistor Q6 is turned off. At this time, the NMOS transistor Q5 acts as a current sink in the comparator 201. The transistors Q1–Q5 in the comparator 201 form a general differential amplifier circuit and a detailed description thereof will thus be omitted. In the operating mode where the control signal Cont is high in logic, the differential amplifier circuit compares the pulse signal with the reduced operating voltage level from the ring oscillation circuit 200 with the reference voltage signal Vref and amplifies it in accordance with the compared result. The differential amplifier circuit then supplies the resultant pulse signal to the output node N42.

Here, the reference voltage signal Vref applied to the gate of the NMOS transistor Q4 in the comparator 201 has a voltage level which is half the high and low logic levels of the pulse signal from the ring oscillation circuit 200.

The driver 202 buffers the output signal from the comparator 201 and supplies the buffered signal to an output terminal φout. To this end, the driver 202 includes the inverters G13 and G14 connected in series between the node N42 and the output node N45.

As apparent from the above description, according to the present invention, the inverters are used to decrease the operating voltage level, resulting in a reduction in power consumption in the ring oscillation circuit. The comparator is provided to amplify the pulse signal with the reduced operating voltage level from the ring oscillation circuit. Therefore, the driver can output the pulse signal with the predetermined period.

In the case where the ring oscillator of the present invention is provided in a semiconductor device, the operating voltage from the ring oscillation circuit can be reduced to the logic high or low level to be sensed by the comparator. Also, the consumption power in the ring oscillation circuit can be reduced by adjusting widths and lengths of the MOS transistors constituting the inverters. Namely, the consumption power in the ring oscillation circuit is proportioned to the square of the operating voltage. In this connection, the inverter chain is provided in the ring oscillation circuit to supply the reduced operating voltage. Therefore, the ring oscillator of the present invention has the effect of significantly reducing the power consumption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A ring oscillator for a semiconductor device comprising:

ring oscillation means for generating a pulse signal according to a logic state of a control signal, said pulse signal having a predetermined period and a reduced operating voltage level; and comparison means for comparing the pulse signal from said ring oscillation means with a reference voltage signal according to the logic state of the control signal and amplifying it in accordance with the compared result.

2. A ring oscillator for a semiconductor device as set forth in claim 1, further comprising drive means for buffering an output signal from said comparison means.

3. A ring oscillator for a semiconductor device as set forth in claim 2, wherein said drive means includes a plurality of inverters connected in series to an output terminal of said comparison means.

4. A ring oscillator for a semiconductor device as set forth in claim 1, wherein said ring oscillation means includes:

a NAND gate; and an even number of inverters connected in series between said NAND gate and said comparison means;

said NAND gate NANDing the control signal and an output signal from the last one of said inverters and outputting the NANDed result to the first one of said inverters; and said inverters supplying said pulse signal to said comparison means.

5. A ring oscillator for a semiconductor device as set forth in claim 4, wherein said NAND gate includes:

a first input terminal for inputting the control signal;

a second input terminal for inputting the output signal from said last inverter;

an output terminal for outputting the NANDed result to said first inverter;

a third input terminal connected to a supply voltage source;

a ground terminal connected to a ground voltage source;

first resistor means having its one side connected to said third input terminal;

first and second PMOS transistors connected in parallel between the other side of said first resistor means and said output terminal, said first PMOS transistor having its gate connected to said first input terminal, said second PMOS transistor having its gate connected to said second input terminal;

second resistor means having its one side connected to said ground terminal;

a first NMOS transistor having its one side connected to the other side of said second resistor means and its gate connected to said second input terminal; and a second NMOS transistor connected between the other side of said first NMOS transistor and said output terminal, said second NMOS transistor having its gate connected to said first input terminal.

6. A ring oscillator for a semiconductor device as set forth in claim 5, wherein said first resistor means includes a PMOS transistor and said second resistor means includes an NMOS transistor.

7. A ring oscillator for a semiconductor device as set forth in claim 4, wherein each of said inverters includes:

a first input terminal for inputting an output signal from said NAND gate or the preceding inverter;

a second input terminal connected to a supply voltage source;

a ground terminal connected to a ground voltage source;

an output terminal connected to said NAND gate or the following inverter;

first resistor means having its one side connected to said second input terminal;

a PMOS transistor connected between the other side of said first resistor means and said output terminal, said PMOS transistor having its gate connected to said first input terminal;

second resistor means having its one side connected to said ground terminal; and an NMOS transistor connected between the other side of said second resistor means and said output terminal, said NMOS transistor having its gate connected to said first input terminal.

8. A ring oscillator for a semiconductor device as set forth in claim 7, wherein said first resistor means includes a PMOS transistor and said second resistor means includes an NMOS transistor.

9. A ring oscillator for a semiconductor device as set forth in claim 1, wherein said comparison means includes:

a first input terminal for inputting the control signal;

a second input terminal for inputting the pulse signal from said ring oscillation means;

an output terminal for outputting the amplified signal;

a third input terminal connected to a supply voltage source;

a ground terminal connected to a ground voltage source;

a first PMOS transistor having its one side connected to said third input terminal and its other side connected to said output terminal;

a second PMOS transistor having its one side connected to said third input terminal and its other side and gate connected in common to a gate of said first PMOS transistor;

a third PMOS transistor having its one side connected to said third input terminal, its other side connected to said output terminal and its gate connected to said first input terminal;

a first NMOS transistor having its one side connected to said ground terminal and its gate connected to said first input terminal;

a second NMOS transistor connected between the other side of said first NMOS transistor and said output terminal, said second NMOS transistor having its gate connected to said second input terminal; and a third NMOS transistor connected between the other side of said first NMOS transistor and the other side of said second PMOS transistor, said third NMOS transistor having its gate for inputting the reference voltage signal.

* * * * *